(12) United States Patent
Kuo

(10) Patent No.: US 10,810,120 B2
(45) Date of Patent: *Oct. 20, 2020

(54) ENCODER, ASSOCIATED ENCODING METHOD AND FLASH MEMORY CONTROLLER

(71) Applicant: Silicon Motion Inc., Hsinchu County (TW)

(72) Inventor: Shiuan-Hao Kuo, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 25 days.

This patent is subject to a terminal disclaimer.

(21) Appl. No.: 16/273,093

(22) Filed: Feb. 11, 2019

(65) Prior Publication Data

US 2020/0117591 A1 Apr. 16, 2020

(30) Foreign Application Priority Data

Oct. 12, 2018 (TW) .............................. 107136009 A

(51) Int. Cl.
  *G06F 11/00* (2006.01)
  *G06F 12/02* (2006.01)
  *G11C 7/10* (2006.01)
  *G06F 9/30* (2018.01)

(52) U.S. Cl.
  CPC ........ *G06F 12/0246* (2013.01); *G06F 9/3004* (2013.01); *G11C 7/1006* (2013.01)

(58) Field of Classification Search
  None
  See application file for complete search history.

(56) References Cited

U.S. PATENT DOCUMENTS

| 7,162,684 | B2 | 1/2007 | Hocevar |
| 8,151,160 | B1 | 4/2012 | Andreev |
| 8,281,214 | B2 | 10/2012 | Yang |
| 2007/0283218 | A1 | 12/2007 | Gopalakrishnan |
| 2009/0259915 | A1* | 10/2009 | Livshitz ............. H03M 13/1185 714/758 |
| 2010/0100788 | A1* | 4/2010 | Yang .................... H03M 13/116 714/752 |

(Continued)

FOREIGN PATENT DOCUMENTS

CN  102340318 A  2/2012
WO  2018/041843 A1  3/2018

*Primary Examiner* — Mujtaba M Chaudry
(74) *Attorney, Agent, or Firm* — Winston Hsu

(57) ABSTRACT

An encoder of a flash memory controller is provided, which includes a barrel shifter module, an inverse matrix calculating circuit and a calculating circuit. The barrel shifter module processes multiple data blocks to generate multiple partial parity blocks including a first portion, a second portion and a third portion. The inverse matrix calculating circuit performs inverse matrix calculating operations on the first portion to generate a first portion of parity blocks. The calculating circuit performs inverse matrix calculating operations on the second portion and the third portion according to the first portion of the parity blocks, to generate a second portion of the parity blocks and a third portion of the parity blocks. The first portion of the parity blocks, the second portion of the parity blocks, and the third portion of the parity blocks serve as multiple parity blocks generated in response to encoding the data blocks.

15 Claims, 5 Drawing Sheets

(56) References Cited

U.S. PATENT DOCUMENTS

| | | |
|---|---|---|
| 2010/0251059 A1 | 9/2010 | Dielissen |
| 2011/0191650 A1* | 8/2011 | Yokokawa ......... H03M 13/1137 714/752 |
| 2013/0275827 A1* | 10/2013 | Wang ................. H03M 13/1117 714/752 |
| 2015/0026536 A1* | 1/2015 | Hubris ............... H03M 13/1142 714/758 |
| 2015/0229331 A1* | 8/2015 | Panteleev .......... H03M 13/1171 360/53 |
| 2017/0063400 A1* | 3/2017 | Zhang ................ G06F 11/1012 |
| 2017/0149445 A1 | 5/2017 | Liu |
| 2018/0034484 A1* | 2/2018 | Galbraith ............ H03M 13/256 |
| 2018/0246783 A1 | 8/2018 | Avraham |

\* cited by examiner

ENCODER, ASSOCIATED ENCODING METHOD AND FLASH MEMORY CONTROLLER

BACKGROUND OF THE INVENTION

1. Field of the Invention

The present invention is related to encoders, and more particularly, to an encoder for a flash memory controller, an associated encoding method, and an associated flash memory controller.

2. Description of the Prior Art

A general encoder may have a parity-check matrix in order to check whether the parity generated by the encoder is correct. For example, after the encoder encodes data to generate parity (e.g. check code), the encoder may multiply the data and the parity by this parity-check matrix, where if the multiplication result is "0", the encoding is determined to be correct; otherwise, the encoding is determined to be incorrect. In response to this parity-check matrix, the encoder may have a corresponding parity generator matrix in order to generate appropriate parity. The parity generator matrix is not able to be found under some conditions, however. The encoder may need to perform multiple matrix multiplying operations and/or compensation/adjustment operations in order to generate parity that is similar to the parity generated by the parity generator matrix, and therefore complexity of the encoder increases. More particularly, the aforementioned multiple matrix multiplying operations usually comprise circular convolution calculations, which may greatly increase hardware costs of the encoder.

SUMMARY OF THE INVENTION

An objective of the present invention is to provide an encoder, which is able to reduce the hardware for the circular convolution calculations within the encoder in order to prevent the condition of greatly increasing hardware costs.

In an embodiment of the present invention, an encoder configured in a flash memory controller is disclosed, wherein the encoder comprises a barrel shifter module, a first inverse matrix calculating circuit and a calculating circuit. In the operations of the encoder: the barrel shifter module is arranged to process a plurality of data blocks to generate a plurality of partial parity blocks, wherein the plurality of partial parity blocks comprise a first portion, a second portion and a third portion; the first inverse matrix calculating circuit is coupled to the barrel shifter module, and is arranged to perform inverse matrix calculating operations on the first portion to generate a first portion of parity blocks; the calculating circuit is coupled to the barrel shifter module and the first inverse matrix calculating circuit, and is arranged to perform the inverse matrix calculating operations on the second portion and the third portion according to the first portion of the parity blocks, to generate a second portion of the parity blocks and a third portion of the parity blocks; wherein the first portion of the parity blocks, the second portion of the parity blocks, and the third portion of the parity blocks serve as a plurality of parity blocks generated by the encoder in response to the plurality of data blocks, and the plurality of data blocks and the plurality of parity blocks are written into a flash memory.

In another embodiment of the present invention, a flash memory controller is disclosed, where the flash memory controller is arranged to access a flash memory module, and the flash memory controller comprises a memory, a microprocessor and an encoder, where the memory is arranged to store a program code, the microprocessor is arranged to execute the program code to control access to the flash memory module, and the encoder is arranged to encode a plurality of data blocks to obtain a plurality of parity blocks. The encoder comprises a barrel shifter module, a first inverse matrix calculating circuit and a calculating circuit. In the operations of the encoder: the barrel shifter module is arranged to process the plurality of data blocks to generate a plurality of partial parity blocks, wherein the plurality of partial parity blocks comprise a first portion, a second portion and a third portion; the first inverse matrix calculating circuit is coupled to the barrel shifter module, and is arranged to perform inverse matrix calculating operations on the first portion to generate a first portion of parity blocks; the calculating circuit is coupled to the barrel shifter module and the first inverse matrix calculating circuit, and is arranged to perform the inverse matrix calculating operations on the second portion and the third portion according to the first portion of the parity blocks, to generate a second portion of the parity blocks and a third portion of the parity blocks; wherein the first portion of the parity blocks, the second portion of the parity blocks, and the third portion of the parity blocks serve as the plurality of parity blocks generated by the encoder in response to the plurality of data blocks, and the plurality of data blocks and the plurality of parity blocks are written into a flash memory.

In another embodiment of the present invention, an encoding method for a flash memory controller is disclosed, which comprises the following steps: processing a plurality of data blocks to generate a plurality of partial parity blocks, wherein the plurality of partial parity blocks comprise a first portion, a second portion and a third portion; performing inverse matrix calculating operations on the first portion to generate a first portion of parity blocks; performing the inverse matrix calculating operations on the second portion and the third portion according to the first portion of the parity blocks, to generate a second portion of the parity blocks and a third portion of the parity blocks, wherein the first portion of the parity blocks, the second portion of the parity blocks, and the third portion of the parity blocks serve as a plurality of parity blocks generated by the encoder in response to the plurality of data blocks; and writing the plurality of data blocks and the plurality of parity blocks into a flash memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
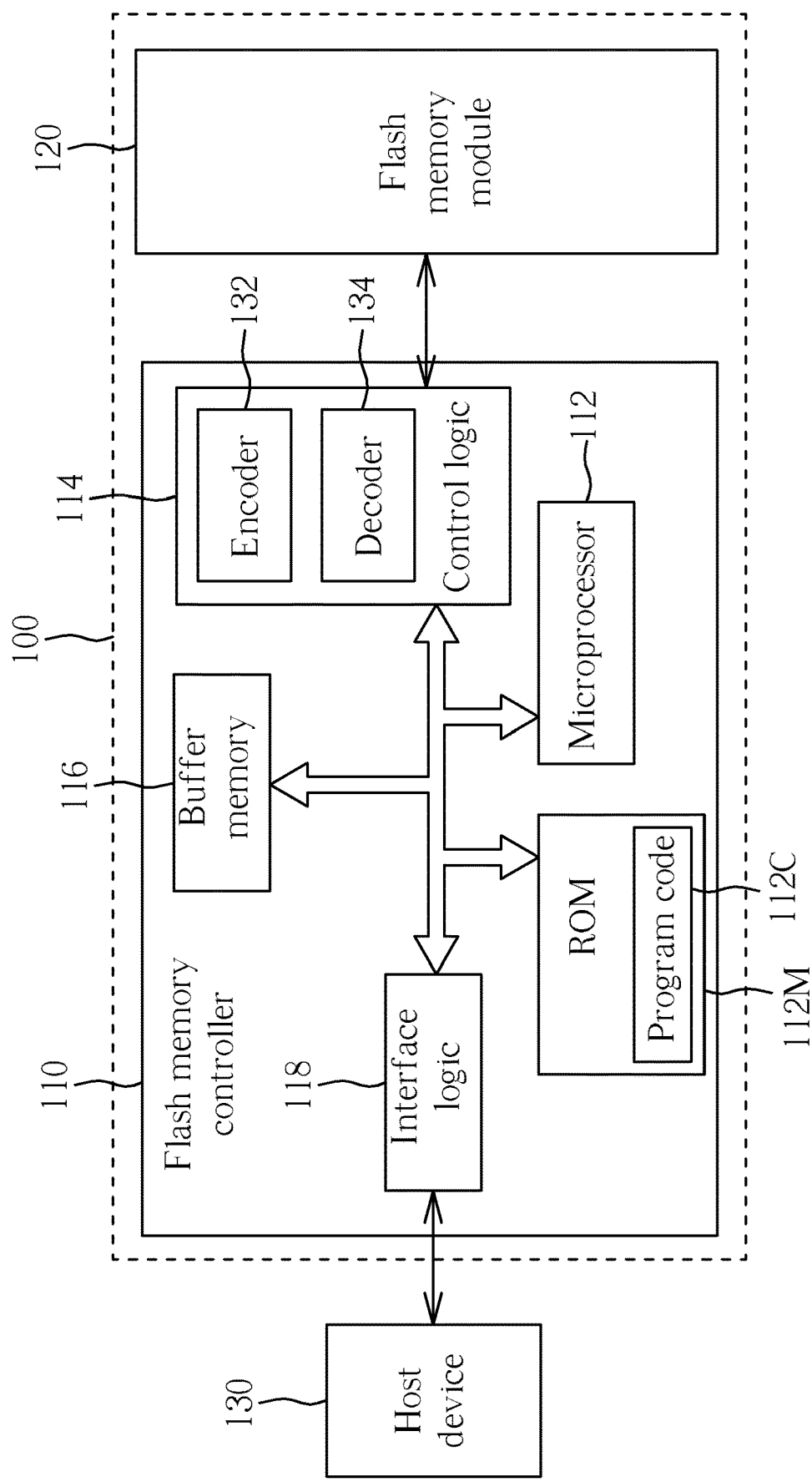
FIG. 1 is a diagram illustrating a memory device according to an embodiment of the present invention.

FIG. 1 is a diagram illustrating a memory device 100 according to an embodiment of the present invention. The memory device 100 comprises a flash memory module 120 and a flash memory controller 110, and the flash memory controller 110 is arranged to access the flash memory module 120. According to this embodiment, the flash memory controller 110 comprises a microprocessor 112, a read only memory (ROM) 112M, a control logic 114, a buffer memory 116 and an interface logic 118. The ROM 112M is arranged to store a program code 112C, and the microprocessor 112 is arranged to execute the program code 112C to control access to the flash memory module 120. The control logic 114 comprises an encoder 132 and a decoder 134, where the encoder 132 is arranged to encode data that is written into the flash memory module 120 to generate a corresponding check code (or error correction code (ECC)), and the decoder 134 is arranged to decode data that is read out from the flash memory module 120.

Under a typical condition, the flash memory module 120 comprises a plurality of flash memory chips, and each of the plurality of flash memory chips comprises a plurality of blocks. The controller (e.g. the flash memory controller 110 controlled by the microprocessor 112 through executing the program code 112C) performs a copying data operation, an erasing data operation or a combining data operation on the flash memory 120 in the unit of blocks. In addition, a block may record a specific number of data pages, where the controller (e.g. the flash memory controller 110 controlled by the microprocessor 112 through executing the program code 112C) performs a writing data operation on the flash memory module 120 in the unit of data pages.

In practice, the memory controller 110 controlled by the microprocessor 112 through executing the program code 112C may utilize internal components thereof to perform various control operations; for example, utilizing the control logic 114 to control access operations of the flash memory module 120 (more particularly, access operations on at least one block or at least one data page), utilizing the buffer memory 116 to perform required buffer operations, and utilizing the interface logic 118 to communicate with the host device 130.

In an embodiment, the memory device 100 may be a portable memory device (e.g. a memory card conforming to SD/MMC, CF, MS or XD specifications), and the host device 130 may be an electronic device that is connectable with a portable memory device; for example, mobile phones, laptop computers, personal computers, etc. In another embodiment, the memory device 100 may be configured in an electronic device (for example, in a mobile phone, a laptop computer or a personal computer), and the host device 130 may be a processor of this electronic device.

In this embodiment, the encoder 132 is a low-density parity check (LDPC) code encoder circuit, which is able to generate a corresponding parity (e.g. check code) according to data from the host device 130, and the parity generated by the encoder 132 conforms to a parity-check matrix. More particularly, referring to FIG. 2, assuming that the parity-check matrix is a matrix having a size of c*t (where, for example, c=5, t=48, or any other appropriate value), the parity-check matrix may be divided into a left-side matrix M (having a size of c*(t−c)) and a right-side matrix K (having a size of c*c). In order to find a parity generator matrix corresponding to the parity-check matrix, an inverse matrix $K^{-1}$ of the matrix L is found, and then the inverse matrix $K^{-1}$ is multiplied by the matrix M to obtain a matrix P, where a transpose matrix of the matrix P may be taken as the parity generator matrix. After finding the transpose matrix of the matrix P, the encoder 132 may multiply the data from the host device 130 by the transpose matrix of the matrix P to obtain a parity corresponding to the data, and the encoder 132 then multiplies both the data and this parity by the parity-check matrix in order to determine whether this parity is correct. For example, if the multiplication result is "0", the encoding is determined to be correct; otherwise, the encoding is determined to be incorrect. After determining the encoding is correct, the data and the corresponding parity are written into a data page within the flash memory module 120.

It should be noted that each unit within the aforementioned parity-check matrix is a block in practice, and the block may be a square matrix (e.g. a 64*64 matrix or a 192*192 matrix). Thus, the parity-check matrix comprises c*t blocks.

Under some conditions, it might be not easy to find the inverse matrix $K^{-1}$, and the encoder 132 may therefore need to perform multiple matrix multiplying operations and/or compensation/adjustment operations to obtain content that is similar to the inverse matrix $K^{-1}$, in order to find the parity generator matrix and generate the parity. The present invention therefore provides a circuit structure which can finish the operations of the encoder 132, which is able to save hardware costs of the encoder as much as possible. It should be noted that the encoding process of the encoder 132 involves many complicated mathematics operations; the main point of the present invention is the design of the circuit structure, and related matrix descriptions and derivation process are omitted, for brevity.

Figure 3:
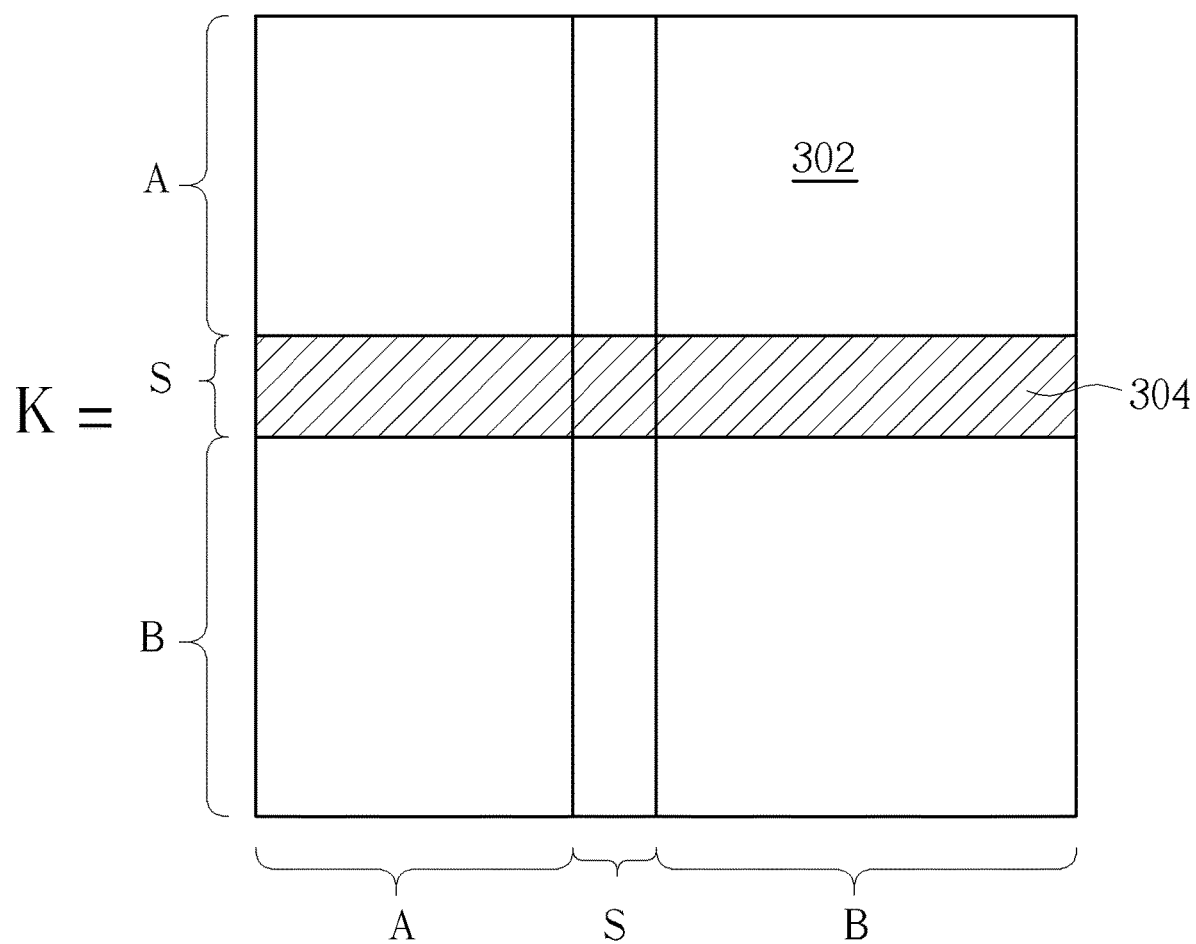
FIG. 3 is a diagram illustrating a matrix according to an embodiment of the present invention.

FIG. 3 is a diagram illustrating the matrix K according to an embodiment of the present invention. Rows and columns of the matrix K are respectively divided into three segments, and these three segment respectively comprise A blocks, S blocks and B blocks, where A, S and B are positive integers. In this embodiment, the upper-right region of the matrix K shown in FIG. 3 (such as a region 302) is a blank region, where all values within all blocks within the region 302 are zero. The shading portion such as a region 304 is a non-zero region, where each of the blocks within the region 304 comprises at least one non-zero value. Additionally, other regions of the matrix K are not limited to blank regions or non-zero regions. The encoder 132 shown in the following descriptions is designed based in the matrix K shown in FIG. 3, but the present invention is not limited thereto.

Figure 4:
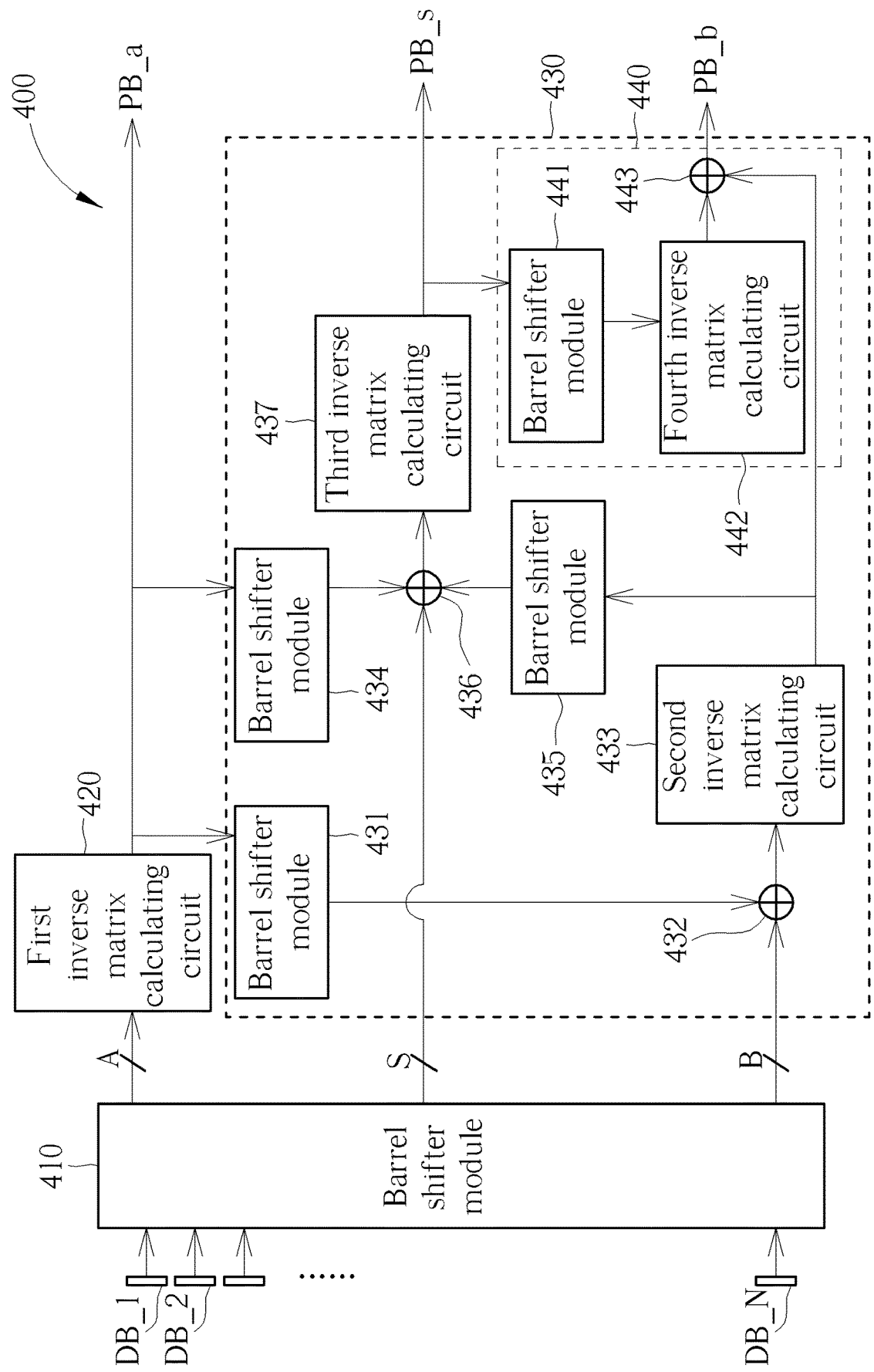
FIG. 4 is a diagram illustrating an encoder according to an embodiment of the present invention.

FIG. 4 is a diagram illustrating an encoder 400 according to an embodiment of the present invention, where the encoder 400 may be the encoder 132 shown in FIG. 1. As shown in FIG. 4, the encoder 400 comprises a barrel shifter module 410, a first inverse matrix calculating circuit 420 and a calculating circuit 430, where the calculating 430 comprises three barrel shifter modules 431, 434 and 435, a first adjustment circuit 432, a second inverse matrix calculating circuit 433, a second adjustment circuit 436, a third inverse matrix calculating circuit 437 and a calculating circuit 440, where the calculating circuit 440 comprises a barrel shifter module 441, a fourth inverse matrix calculating circuit 442 and a third adjustment circuit 443. In this embodiment, the barrel shifter modules 410, 431, 434, 435, 441 may be implemented by multiple barrel shifters and multiple accumulator circuits, and the first inverse matrix calculating circuit 420, the second inverse matrix calculating circuit 433, the third inverse matrix calculating circuit 437 and the fourth inverse matrix calculating circuit 442 may be implemented by a circular convolution calculating circuit and a compensation circuit. In this embodiment, the encoder 400 divides a set of data from the host device 130 into a plurality of data blocks (the plurality of data blocks are N data blocks DB_1-DB_N (such as data blocks DB_1, DB2, . . . and DB_N, where N is a positive integer) in this embodiment), and encodes the data blocks DB_1-DB_N to generate a plurality of parity blocks (the plurality of parity blocks are (A+S+B) parity blocks PB_a, PB_s and PB_b). It should be noted that the size of a data block (e.g. each of the data blocks DB_1-DB_N) and that of a parity block (e.g. each of the parity blocks PB_a, PB_s and PB_b) are the same, and the size of the data block can be decided by the designer; for example, 64*64 bits or 192*192 bits.

In the operations of the encoder 400, the barrel shifter module 410 may process the data blocks DB_1-DB_N to generate a plurality of partial parity blocks. More particularly, the barrel shifter module 410 respectively shifts the data blocks DB_1-DB_N through a first barrel shifter inside, and adds up the shifted data blocks through an accumulator circuit to obtain a first partial parity block; then, the barrel shifter module 410 respectively shifts the data blocks DB_1-DB_N through a second barrel shifter inside, and adds up the shifted data blocks through the accumulator circuit to obtain a second partial parity block; and the rest may be induced by analogy, where the barrel shifter module 410 totally generates (A+S+B) partial parity blocks.

The partial parity blocks may be divided into three portions for different processing, where the first portion comprises A partial parity blocks, the second portion comprises S partial parity blocks, and the third portion comprises B partial parity blocks. In the operations of the first inverse matrix calculating circuit 420, the first inverse matrix calculating circuit 420 performs inverse matrix calculating operations (e.g. circular convolution operations and compensation operations) on the A partial parity blocks, to generate A parity blocks PB_a. The calculating circuit 430 then generate S parity blocks PB_s and B parity blocks PB_b according to the A parity blocks PB_a, the S partial parity blocks and the B partial parity blocks.

In detail, the barrel shifter module 431 may process the A parity blocks PB_a to generate B processed blocks, and the first adjustment circuit 432 may add up the B processed blocks and the B partial parity blocks to generate an adjusted third portion of data. The second inverse matrix calculating circuit 433 then performs the inverse matrix calculating operations on the adjusted third portion of data to generate a first calculation result; the barrel shifter module 435 processes the A parity blocks PB_a to generate S first processed blocks; the barrel shifter module 434 processes the first calculation result to generate S second processed blocks; and the second adjustment circuit 436 adds up the S first processed blocks, the S second processed blocks and the S partial parity blocks to generate an adjusted second portion of data. The third inverse matrix calculating circuit 437 then performs the inverse matrix calculating operations on the adjusted second portion of data to generate the S parity blocks PB_s. The barrel shifter module 441 then processes the S parity blocks PB_s to generate B processed blocks; the fourth inverse matrix calculating circuit 442 performs the inverse matrix calculating operations on the B processed blocks to generate a second calculation result; and the third adjustment circuit 443 generates the B parity blocks PB_b according to the first calculation result and the second calculation result.

After the parity blocks PB_a, PB_s and PB_b are generated, the encoder 400 may multiply the data blocks DB_1-DB_N in conjunction with the parity blocks PB_a, PB_s and PB_b by the parity-check matrix in order to determine whether the parity blocks PB_a, PB_s and PB_b are correct. If yes, the flash memory controller 110 will write the data blocks DB_1-DB_N in conjunction with the parity blocks PB_a, PB_s and PB_b into a data page of a block within the flash memory module 120.

Figure 2:
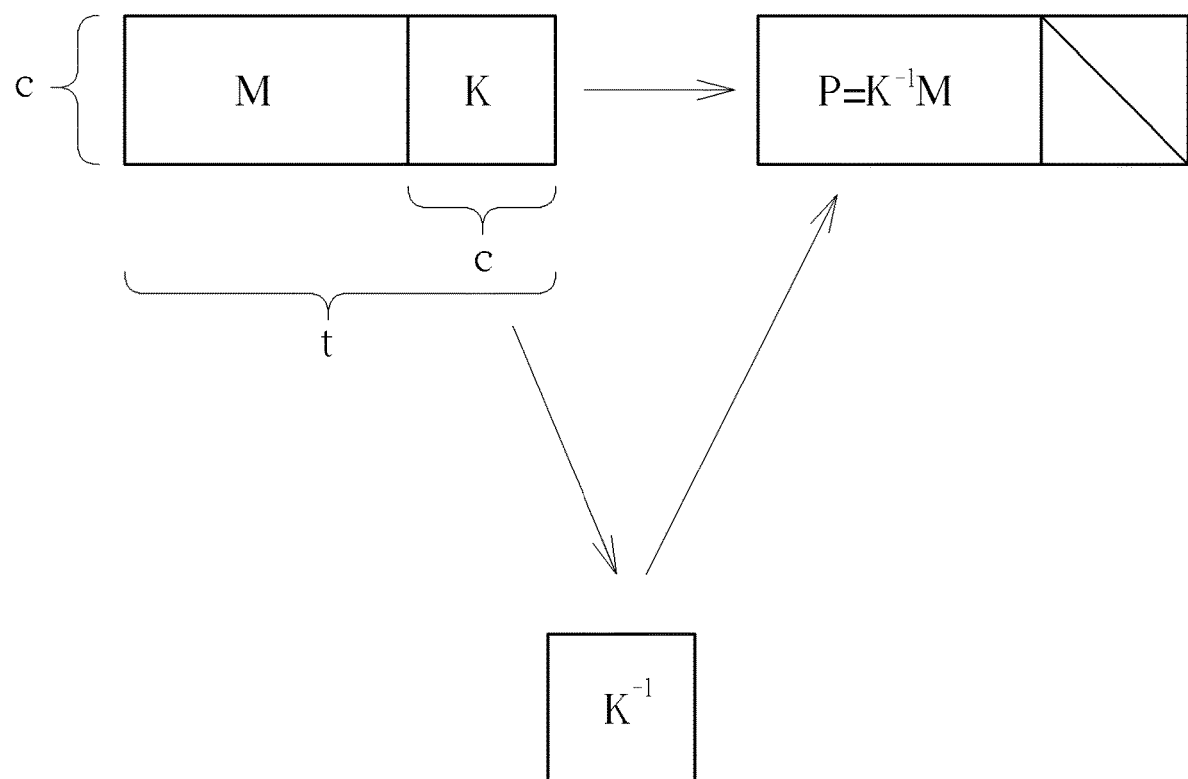
FIG. 2 is a diagram illustrating a parity-check matrix and a parity generator matrix.

In the circuit structure shown in FIG. 4, the barrel shifter module 410 may correspond to the matrix M shown in FIG. 2, and the first inverse matrix calculating circuit 420 and the calculating circuit 430 are arranged to generate content that is similar to the inverse matrix $K^{-1}$ shown in FIG. 2 in order to generate the parity blocks PB_a, PB_s and PB_b under a condition that the inverse matrix $K^{-1}$ cannot be found. Additionally, the encoder 400 can greatly reduce the number of circular convolution calculating circuits in the inverse matrix calculating circuit. For example, assuming that K is a 10*10 matrix, and A=4, S=1, B=5, one hundred circular convolution calculating circuits are needed for the encoder of the related art; in this embodiment, the first inverse matrix calculating circuit 420 needs sixteen (a=4, 4*4) circular convolution calculating circuits, the second inverse matrix calculating circuit 433 needs twenty-five (b=5, 5*5) circular convolution calculating circuits, the third inverse matrix calculating circuit 437 only needs one circular convolution calculating circuit, and the fourth inverse matrix calculating circuit 442 needs twenty-five circular convolution calculating circuits, where only sixty-seven circular convolution calculating circuits are needed in this embodiment, meaning the hardware costs of the encoder 400 can be greatly reduced.

Additionally, the first inverse matrix calculating circuit 420 can immediately perform the inverse matrix calculating operations on the A partial parity blocks outputted by the barrel shifter module 410, to generate the A parity blocks and output to back-end circuit (s) in this embodiment. If the following calculating operations performed by the second inverse matrix calculating circuit 433, the third inverse matrix calculating circuit 437 and the fourth inverse matrix calculating circuit 442 are not complicated, the encoder 400 can continuously output parity blocks to the back-end circuit (s) without delay in order to improve overall performance of the system.

Figure 5:
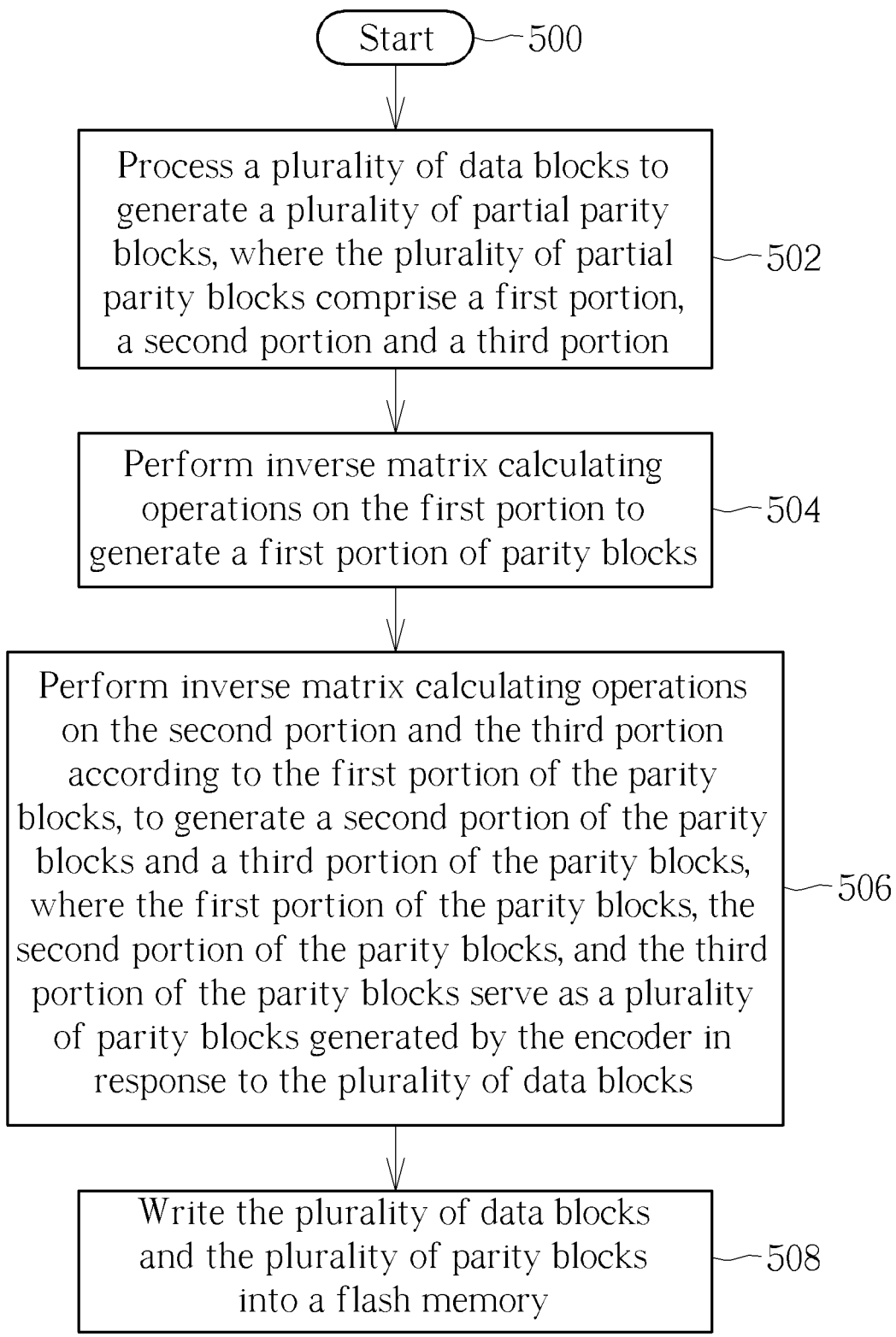
FIG. 5 is a flowchart illustrating an encoding method according to an embodiment of the present invention.

Referring to FIG. 5, which is a flowchart illustrating an encoding method according to an embodiment of the present invention, and referring to FIGS. 1-5 and the descriptions in the above embodiments, the working flow of the decoding method is as follows.

Step 500: the flow starts.

Step 502: process a plurality of data blocks to generate a plurality of partial parity blocks, where the plurality of partial parity blocks comprise a first portion, a second portion and a third portion.

Step 504: perform inverse matrix calculating operations on the first portion to generate a first portion of parity blocks.

Step 506: perform the inverse matrix calculating operations on the second portion and the third portion according to the first portion of the parity blocks, to generate a second portion of the parity blocks and a third portion of the parity blocks, where the first portion of the parity blocks, the second portion of the parity blocks, and the third portion of the parity blocks serve as a plurality of parity blocks generated by the encoder in response to the plurality of data blocks.

Step 508: write the plurality of data blocks and the plurality of parity blocks into a flash memory.

Briefly summarized, the encoder of the present invention performs operations by dividing partial parity blocks into three portions in order to reduce the hardware needed for circular convolution calculating circuits in the encoder under a condition that parity blocks can be generated. Thus, problems of the related art (e.g. high hardware costs) can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An encoder configured in a flash memory controller, comprising:
   a barrel shifter module, arranged to process a plurality of data blocks to generate a plurality of partial parity blocks, wherein each of the partial parity blocks is generated by shifting the data blocks and adding up shifted data blocks, and the plurality of partial parity blocks collectively comprise a first portion, a second portion and a third portion;
   a first inverse matrix calculating circuit, coupled to the barrel shifter module, arranged to perform inverse matrix calculating operations on the first portion of the partial parity blocks to generate a first portion of parity blocks; and
   a calculating circuit, coupled to the barrel shifter module and the first inverse matrix calculating circuit, arranged to perform inverse matrix calculating operations on the second portion of the partial parity blocks and the third portion of the partial parity blocks according to the first portion of the parity blocks, to generate a second portion of the parity blocks and a third portion of the parity blocks, respectively;
   wherein the first portion of the parity blocks, the second portion of the parity blocks, and the third portion of the parity blocks collectively serve as a plurality of parity blocks generated by the encoder in response to the plurality of data blocks, and the plurality of data blocks and the plurality of parity blocks are written into a flash memory;
   wherein the calculating circuit comprises:
   a first adjustment circuit, coupled to the first inverse matrix calculating circuit, arranged to adjust the third portion of the plurality of partial parity blocks according to the first portion of the parity blocks, to generate an adjusted third portion;
   a second inverse matrix calculating circuit, coupled to the first adjustment circuit, arranged to perform the inverse matrix calculating operations to generate a first calculation result;
   a second adjustment circuit, coupled to the barrel shifter module, the first inverse matrix calculating circuit and the second inverse matrix calculating circuit, arranged to adjust the second portion of the plurality of partial parity blocks according to the first portion of the parity blocks and the first calculation result, to generate an adjusted second portion;
   a third inverse matrix calculating circuit, coupled to the second adjustment circuit, arranged to perform the inverse matrix calculating operations on the adjusted second portion to generate the second portion of the parity blocks; and
   another calculating circuit, coupled to the second inverse matrix calculating circuit and the third inverse matrix calculating circuit, arranged to generate the third portion of the parity blocks according to the first calculation result and the second portion of the parity blocks.

2. The encoder of claim 1, wherein the first portion of the parity blocks comprises A blocks, the third portion of the plurality of partial parity blocks comprises B partial parity blocks, and the encoder further comprises:
   another barrel shifter module, coupled to the first inverse matrix calculating circuit and the first adjustment circuit, arranged to process the first portion of the parity blocks to generate B processed blocks;
   wherein the first adjustment circuit adds up the B processed blocks and the B partial parity blocks to generate the adjusted third portion, and A and B are positive integers.

3. The encoder of claim 1, wherein the first portion of the parity blocks comprises A blocks, the first calculation result comprises B blocks, the third portion of the plurality of partial parity blocks comprises S partial parity blocks, and the encoder further comprises:
   another barrel shifter module, arranged to process the first portion of the parity blocks to generate S first processed blocks, and process the first calculation result to generate S second processed blocks;
   wherein the second adjustment circuit adds up the S first processed blocks, the S second processed blocks and the S partial parity blocks to generate the adjusted second portion, and A, S and B are positive integers.

4. The encoder of claim 1, wherein said another calculating circuit comprises:
   a fourth inverse matrix calculating circuit, coupled to the third inverse matrix calculating circuit, arranged to perform inverse matrix calculating operations according to the second portion of the parity blocks, to generate a second calculation result; and
   a third adjustment circuit, coupled to the second inverse matrix calculating circuit and the fourth inverse matrix calculating circuit, arranged to generate the third portion of the parity blocks according to the first calculation result and the second calculation result.

5. The encoder of claim 4, wherein the second portion of the parity blocks comprises S blocks, the first calculation result comprises B blocks, and the encoder further comprises:
   another barrel shifter module, coupled to the third inverse matrix calculating circuit, arranged to process the second portion of the parity blocks to generate B processed blocks;
   wherein the third adjustment circuit adds up the B processed blocks and the B blocks to generate the third portion of the parity blocks, and S and B are positive integers.

6. The encoder of claim 1, which is a low-density parity check (LDPC) code encoder circuit.

7. A flash memory controller, arranged to access a flash memory module, comprising:
   a memory, arranged to store a program code;
   a microprocessor, arranged to execute the program code to control access to the flash memory module; and
   an encoder, comprising:
     a barrel shifter module, arranged to process a plurality of data blocks to generate a plurality of partial parity blocks, wherein each of the partial parity blocks is generated by shifting the data blocks and adding up shifted data blocks, and the plurality of partial parity blocks collectively comprise a first portion, a second portion and a third portion;
     a first inverse matrix calculating circuit, coupled to the barrel shifter module, arranged to perform inverse matrix calculating operations on the first portion of the partial parity blocks to generate a first portion of parity blocks; and a calculating circuit, coupled to the barrel shifter module and the first inverse matrix calculating circuit, arranged to perform inverse matrix calculating operations on the second portion of the partial parity blocks and the third portion of the partial parity blocks according to the first portion of the parity blocks, to generate a second portion of the parity blocks and a third portion of the parity blocks;

wherein the first portion of the parity blocks, the second portion of the parity blocks, and the third portion of the parity blocks collectively serve as a plurality of parity blocks generated by the encoder in response to the plurality of data blocks, and the plurality of data blocks and the plurality of parity blocks are written into the flash memory module;

wherein the calculating circuit comprises:

a first adjustment circuit, coupled to the first inverse matrix calculating circuit, arranged to adjust the third portion of the plurality of partial parity blocks according to the first portion of the parity blocks, to generate an adjusted third portion;

a second inverse matrix calculating circuit, coupled to the first adjustment circuit, arranged to perform the inverse matrix calculating operations to generate a first calculation result;

a second adjustment circuit, coupled to the barrel shifter module, the first inverse matrix calculating circuit and the second inverse matrix calculating circuit, arranged to adjust the second portion of the plurality of partial parity blocks according to the first portion of the parity blocks and the first calculation result, to generate an adjusted second portion;

a third inverse matrix calculating circuit, coupled to the second adjustment circuit, arranged to perform inverse matrix calculating operations on the adjusted second portion to generate the second portion of the parity blocks; and another calculating circuit, coupled to the second inverse matrix calculating circuit and the third inverse matrix calculating circuit, arranged to generate the third portion of the parity blocks according to the first calculation result and the second portion of the parity blocks.

8. The flash memory controller of claim 7, wherein the first portion of the parity blocks comprises A blocks, the third portion of the plurality of partial parity blocks comprises B partial parity blocks, and the encoder further comprises:

another barrel shifter module, coupled to the first inverse matrix calculating circuit and the first adjustment circuit, arranged to process the first portion of the parity blocks to generate B processed blocks;

wherein the first adjustment circuit adds up the B processed blocks and the B partial parity blocks to generate the adjusted third portion, and A and B are positive integers.

9. The flash memory controller of claim 7, wherein the first portion of the parity blocks comprises A blocks, the first calculation result comprises B blocks, the third portion of the plurality of partial parity blocks comprises S partial parity blocks, and the encoder further comprises:

another barrel shifter module, arranged to process the first portion of the parity blocks to generate S first processed blocks, and process the first calculation result to generate S second processed blocks;

wherein the second adjustment circuit adds up the S first processed blocks, the S second processed blocks and the S partial parity blocks to generate the adjusted second portion, and A, S and B are positive integers.

10. The flash memory controller of claim 7, wherein said another calculating circuit comprises:

a fourth inverse matrix calculating circuit, coupled to the third inverse matrix calculating circuit, arranged to perform inverse matrix calculating operations according to the second portion of the parity blocks, to generate a second calculation result; and a third adjustment circuit, coupled to the second inverse matrix calculating circuit and the fourth inverse matrix calculating circuit, arranged to generate the third portion of the parity blocks according to the first calculation result and the second calculation result.

11. The flash memory controller of claim 10, wherein the second portion of the parity blocks comprises S blocks, the first calculation result comprises B blocks, and the encoder further comprises:

another barrel shifter module, coupled to the third inverse matrix calculating circuit, arranged to process the second portion of the parity blocks to generate B processed blocks;

wherein the third adjustment circuit adds up the B processed blocks and the B blocks to generate the third portion of the parity blocks, and S and B are positive integers.

12. The flash memory controller of claim 7, wherein the encoder is a low-density parity check (LDPC) code encoder circuit.

13. An encoding method for a flash memory controller, comprising:

processing a plurality of data blocks to generate a plurality of partial parity blocks, wherein each of the partial parity blocks is generated by shifting the data blocks and adding up shifted data blocks, and the plurality of partial parity blocks collectively comprise a first portion, a second portion and a third portion;

performing inverse matrix calculating operations on the first portion of the partial parity blocks to generate a first portion of parity blocks;

performing inverse matrix calculating operations on the second portion of the partial parity blocks and the third portion of the partial parity blocks according to the first portion of the parity blocks, to generate a second portion of the parity blocks and a third portion of the parity blocks, wherein the first portion of the parity blocks, the second portion of the parity blocks, and the third portion of the parity blocks collectively serve as a plurality of parity blocks generated by the encoder in response to the plurality of data blocks; and writing the plurality of data blocks and the plurality of parity blocks into a flash memory;

wherein the step of performing the inverse matrix calculating operations on the second portion and the third portion according to the first portion of the parity blocks to generate the second portion of the parity blocks and the third portion of the parity blocks comprises:

adjusting the third portion of the plurality of partial parity blocks according to the first portion of the parity blocks, to generate an adjusted third portion;

performing inverse matrix calculating operations to generate a first calculation result;

adjusting the second portion of the plurality of partial parity blocks according to the first portion of the parity blocks and the first calculation result, to generate an adjusted second portion;

performing inverse matrix calculating operations on the adjusted second portion to generate the second portion of the parity blocks; and generating the third portion of the parity blocks according to the first calculation result and the second portion of the parity blocks.

14. The encoder of claim 13, wherein the step of generating the third portion of the parity blocks according to the first calculation result and the second portion of the parity blocks comprises:

performing inverse matrix calculating operations according to the second portion of the parity blocks, to generate a second calculation result; and generating the third portion of the parity blocks according to the first calculation result and the second calculation result.

15. The encoding method of claim 13, which is executed by a low-density parity check (LDPC) code encoder circuit configured in the flash memory controller.

* * * * *